United States Patent
Inui et al.

(10) Patent No.: US 8,065,645 B2
(45) Date of Patent: Nov. 22, 2011

(54) LOGIC CIRCUIT, LOGIC CIRCUIT DESIGN METHOD, LOGIC CIRCUIT DESIGN SYSTEM, AND LOGIC CIRCUIT DESIGN PROGRAM

(75) Inventors: Shigeto Inui, Tokyo (JP); Yasuhiko Hagihara, Tokyo (JP)

(73) Assignee: NEC Corporation, Tokyo (JP)

( * ) Notice: Subject to any disclaimer, the term of this patent is extended or adjusted under 35 U.S.C. 154(b) by 529 days.

(21) Appl. No.: 11/754,410

(22) Filed: May 29, 2007

(65) Prior Publication Data

US 2007/0234242 A1 Oct. 4, 2007

Related U.S. Application Data

(62) Division of application No. 11/086,587, filed on Mar. 23, 2005, now Pat. No. 7,236,006.

(30) Foreign Application Priority Data

Mar. 25, 2004 (JP) .................................. 2004-89750

(51) Int. Cl.
*G06F 9/455* (2006.01)
*G06F 17/50* (2006.01)
(52) U.S. Cl. ........ 716/113; 716/108; 716/111; 716/115; 716/134; 703/19
(58) Field of Classification Search .................. 716/2, 6, 716/10, 106, 107, 108, 111, 113, 115, 132, 716/134; 703/19
See application file for complete search history.

(56) References Cited

U.S. PATENT DOCUMENTS

| 6,828,838 | B1 | 12/2004 | Anshumali et al. | |
|---|---|---|---|---|
| 7,103,857 | B2 | 9/2006 | Nosowicz | |
| 2003/0149943 | A1* | 8/2003 | Yoshikawa | 716/1 |
| 2003/0200517 | A1* | 10/2003 | Jones | 716/6 |

FOREIGN PATENT DOCUMENTS

| JP | H5-256044 | 10/1996 |
|---|---|---|
| JP | 2001-156598 | 6/2001 |
| JP | 2002-202347 | 7/2002 |
| JP | 2004-56238 | 2/2004 |

OTHER PUBLICATIONS

Japanese Office Action with translations.
Harris, D., et al., "SP 25:7: Skew-Tolerant Domino Circuits", IEEE Int'l Solid-State Circuits Conf., p. 422 (1997).

* cited by examiner

*Primary Examiner* — Paul Dinh
*Assistant Examiner* — Nha Nguyen
(74) *Attorney, Agent, or Firm* — Whitham Curtis Christofferson & Cook, PC

(57) ABSTRACT

A latch conversion circuit which is to be added to a basic logic circuit to obtain a latch circuit having an extremely small through delay amount is prepared in advance. Moreover, provided is means for obtaining a latch circuit position whereat the shifting of the clock edge, such as skew or jitter, can be absorbed to the maximum extent possible, and for forming a latch circuit by adding the latch conversion circuit to the basic logic circuit located at the obtained point. Accordingly, a latch circuit which is not, to the extent possible, affected by skew or jitter can be designed.

12 Claims, 7 Drawing Sheets

LOGIC CIRCUIT, LOGIC CIRCUIT DESIGN METHOD, LOGIC CIRCUIT DESIGN SYSTEM, AND LOGIC CIRCUIT DESIGN PROGRAM

CROSS-REFERENCE TO RELATED APPLICATIONS

This application is a divisional of U.S. application Ser. No. 11/086,587, filed Mar. 23, 2005 now U.S. Pat. No. 7,236,006, and the complete contents is herein incorporated by reference.

BACKGROUND OF THE INVENTION

1. Field of the Invention

The present invention relates to a logic circuit, a logic circuit design method, a logic circuit design system, and a logic circuit design program, and particularly relates to a logic circuit, a logic circuit design method, a logic circuit design system, and a logic circuit design program, in which a predetermined basic logic circuit is converted into a latch circuit, and with which a high-speed operation is achieved.

2. Description of the Related Art

To constitute a sequential circuit using a plurality of basic logic circuits, a pipeline method is employed in which, for example, a flip-flop is inserted between one basic logic circuit and the next basic logic circuit. According to a conventional logic circuit design method, a sequential circuit is divided on the basis of a target cycle time, and a flip-flop is inserted between the basic logic circuits. The output of a specific basic logic circuit is held by the flip-flop, and is also inputted to the next basic logic circuit. In this manner, a pipeline is conventionally formed by the insertion of the flip-flop.

To drive the flip-flop, a clock signal is employed. For the distribution of the clock signal, it is necessary to consider clock skew, which is the spatial disproportion of distribution delays and variations in, for example, jitter, which is a time fluctuation. The overhead for the variations in the skew, the jitter or the like reduces the effective cycle time. And especially for high-speed LSIs, there arises a problem that system performance is degraded.

To resolve the problem of the reduction in the effective cycle time due to such skew and jitter, a latch circuit design technique has been proposed that corresponds to the pipeline design for high-speed LSIs. For example, the basic concept for the design of a latch circuit is proposed in Japanese Laid-Open Patent No. 2001-156598 and in David Harris, et al., "Skew-tolerant Domino Circuits", ISSCC 1997 Digest of Technical Papers, pp. 422-423.

However, only the basic circuit design concept for the arrangement, in a circuit to be designed, of latch circuits is described in these documents, which in addition, provide no description of the configuration of a definite latch circuit and of a design method for a target circuit.

For example, according to Japanese Laid-Open Patent No. 2001-156598, clock signal supply means supplies a common clock signal to an input flip-flop circuit, an output flip-flop circuit and a latch circuit, which jointly act as a pipeline having two or more stages. Further, circuit insertion position determination means determines the position whereat the input flip-flop circuit and the output flip-flop circuit, or the latch circuit, are to be inserted, so that the input for the latch circuit is established in the middle of the through period for the latch circuit. In this way, the insertion position is determined by the circuit insertion position determination means, so that the influence on a multi-stage pipeline latch circuit exerted by skew due to a variation in transistor performance is minimized. For the similar reason, the influence on the multi-stage pipeline latch circuit is minimized with respect to the variation of the duty ratio or the like or the jitter caused when the LSI is in operation. In this document, it is stated that, as a result, the operation of an LSI product is stabilized.

Meanwhile, according to Japanese Laid-Open Patent No. 2004-056238, means for determining a flip-flop to be converted into a latch selects a flip-flop which is not to be converted into a latch, and then, latch conversion means converts, into a latch circuit having a through state wherein the output side can borrow the delay margin originating on the input side, the flip-flop which is not selected by the means for determining a flip-flop to be converted into a latch. Thus, the delay in the flip-flop output, the setup time and the clock skew can be reduced. Further, in this document, it is stated that it becomes possible to convert all the flip-flops, for example, flip-flops which do not have a delay margin on the input into latch circuits.

However, according to the conventional latch circuit design method described above, neither the configuration of a latch circuit which is appropriate for latch circuit design nor a circuit design method for converting a logic circuit into a latch circuit are proposed.

SUMMARY OF THE INVENTION

Therefore, an exemplary feature of the present invention is to provide a logic circuit which includes a latch circuit for which through delay amount is extremely small.

Another exemplary feature of the present invention is to provide a design method for a logic circuit which includes a latch circuit.

An additional exemplary feature of the present invention is to provide a design system for a logic circuit which includes a latch circuit.

An additional exemplary feature of the present invention is to provide a design program for a logic circuit which includes a latch circuit.

A logic circuit according to the present invention includes: a basic logic circuit, used for a logic operation, having first and second input terminals and an output terminal; and a latch conversion circuit added between the output terminal of the basic logic circuit and the first and second input terminals of the basic logic circuit to constitute a latch circuit together with the basic logic circuit.

Preferably, the logic circuit further includes: a sequential circuit, having a group of flip-flops and a group of basic logic circuits, to be connected either to the first and second input terminals or to the output terminal of the basic logic circuit used for a logic operation; and a latch conversion circuit for allowing a predetermined basic logic circuit selected from among the group of basic logic circuits of the sequential circuit to function as a latch circuit.

Preferably, in the logic circuit, the latch circuit includes the latch conversion circuit which has a delay time reduction function of reducing the delay time for the transmission signal in the sequential circuit.

Further preferably, the latch conversion circuit of the logic circuit includes: means for generating, from an input clock signal, a first control clock signal and a second control clock signal which have polarities different from each other; first signal transmission means for selectively transmitting a first input signal to the first input terminal of the basic logic circuit on the basis of the first control clock signal; second signal transmission means for selectively transmitting a second input signal to the second input terminal of the basic logic circuit on the basis of the first control clock signal; polarity inversion means for inverting the polarity of a signal output by the basic logic circuit, and outputting the inverted signal; third signal transmission means for selectively transmitting the inverted signal, output by the polarity inversion means, to the first input terminal of the basic logic circuit on the basis of the second control clock signal; and fourth signal transmission means for selectively transmitting the inverted signal, output by the polarity inversion means, to the second input terminal of the basic logic circuit on the basis of the second control clock signal.

Preferably, in the logic circuit, the latch circuit is controlled so that, in a through mode of the latch circuit, the first and the second signal transmission means are in a transmission enabled state, while the third and the fourth signal transmission means are in a transmission disabled state, and in a latch mode of the latch circuit, the first and the second signal transmission means are in a transmission disabled state, while the third and the fourth signal transmission means are in a transmission enabled state.

Preferably, in the logic circuit, the basic logic circuit is a NAND gate or a NOR gate, and the first to fourth signal transmission means are first to fourth transmission gates.

A logic circuit design method according to the present invention includes: deleting flip-flop and latch circuits from a net list for a circuit to be designed; extracting, from the resultant net list, a basic logic circuit to be converted into a latch circuit; and adding a latch conversion circuit to the extracted basic logic circuit.

Preferably, in the logic circuit design method, the extracting of the basic logic circuit is carried out by performing a delay examination process for the net list for a circuit to be designed from which the flip-flop and latch circuits have been deleted, and by searching for a basic logic circuit at a delay position whereat a latch conversion circuit is to be added.

Preferably, in the logic circuit design method, as externally input data used in the step of adding the latch conversion circuit, at least the net list for the circuit to be designed and a library of latch conversion circuits corresponding to various types of basic logic circuits are employed.

Preferably, the logic circuit design method further includes: employing, as input data, a first net list and a library of latch conversion circuits corresponding to various types of basic logic circuits, deleting flip-flop and latch circuits of a sequential circuit from the inputted first net list, inserting, into the first net list, either a signal inversion means, when the deleted sequential circuit is for negative logic, or a non-inverting logic, when the deleted sequential circuit is for positive logic, and newly outputting a second net list; searching the second net list to find a basic logic circuit to which a latch conversion circuit is to be added, and outputting the one or more basic logic circuits to be converted into a latch or latches as a latch addition list; and referring to the latch conversion circuit library in accordance with the latch addition list, and outputting a third net list in which, to the basic logic circuit in the second net list, a corresponding latch conversion circuit is added.

Preferably, in the logic circuit design method, when the basic logic circuit at the delay position to which the latch conversion circuit is to be added is searched for, indefinite areas where, at a leading edge of a clock signal at which the latch circuit becomes in a through state and at a trailing edge of the clock signal, a clock signal and a data signal interfere with each other are obtained, respectively; and wherein a region between the thus obtained indefinite areas is regarded as a range for the arrangement of a latch circuit, and the midpoint of the region is extracted as the optimal point for the latch circuit arrangement.

Preferably, in the logic circuit design method, when the basic logic circuit at the delay position to which the latch conversion circuit is to be added is searched for, an externally predesignated range is excluded as a through delay area obtained after the addition of the latch conversion circuit from the range for the arrangement of a latch circuit, and the remaining areas are obtained as delay margins on the leading edge side and on the trailing edge side.

Preferably, in the logic circuit design method, when the basic logic circuit at the delay position to which the latch conversion circuit is to be added is searched for, a point whereat the remaining areas, which are the delay margins at the leading edge and at the trailing edge, reach their maximum size is searched for, and a basic logic circuit present at that point is extracted.

Preferably, in the logic circuit design method, as a value for the externally predesignated range, a maximum through delay amount according to a delay characteristic obtained after the addition of the latch conversion circuit is described in advance in the latch conversion circuit library.

A logic circuit design system according to the present invention includes: a data processor having latch conversion circuit addition means for deleting flip-flop and latch circuits from a net list for a circuit to be designed, extracting, from the resultant net list, a logic circuit to be converted into a latch circuit, and then adding a latch conversion circuit to the logic circuit; and a storage device for storing processing data cited by the data processor and data showing processing results.

Preferably, in the logic circuit design system, the storage device includes, at the least, as externally input data used for a latch conversion circuit addition process, the net list for the circuit to be designed and a library of latch conversion circuits corresponding to various types of logic circuits.

Preferably, in the logic circuit design system, the latch conversion circuit library includes a maximum through delay amount according to a delay characteristic obtained after the addition of the latch conversion circuit.

Preferably, in the logic circuit design system, the latch conversion circuit addition means includes: flip-flop/latch circuit deletion means for deleting flip-flop and latch circuits in a circuit to be designed from a first net list, replacing, with predetermined logic values, outputs corresponding to the thus deleted circuits, and outputting the results as a second net list; circuit division means for searching the second net list to find a basic logic circuit to be converted into a latch, and outputting the one or more basic logic circuits to be converted into a latch or latches as a latch circuit addition list; and latch circuit insertion means for referring to the latch conversion circuit library in accordance with the latch circuit addition list, adding a corresponding latch conversion circuit to the basic logic circuit which is to be converted into a latch, and outputting the obtained results as a third net list, and in the logic circuit design system, the storage device stores the first to third net lists, the latch circuit addition list and the latch conversion circuit library.

A single-bearing medium tangibly storing a program of machine-readable instructions for a logic circuit design according to the present invention includes: employing, as input data, a first net list and a library of latch conversion circuits corresponding to various types of basic logic circuits, deleting flip-flop and latch circuits of a sequential circuit from the inputted first net list, inserting, into the first net list, either a signal inversion means, when the deleted sequential circuit is for negative logic, or a non-inverting logic, when the deleted sequential circuit is for positive logic, and newly outputting a second net list; searching the second net list to find a basic logic circuit to which a latch conversion circuit is to be added, and outputting the one or more basic logic circuits to be converted into a latch or latches as a latch addition list; and referring to a latch conversion circuit library in accordance with the latch addition list, and outputting a third net list in which, to the basic logic circuit in the second net list, a corresponding latch conversion circuit is added.

According to the logic circuit of the present invention, a basic logic circuit for a logic operation itself can be converted into a latch circuit by use of a latch conversion circuit added to the basic logic circuit. Therefore, the circuit delay amount of the latch circuit in the through mode can be greatly reduced.

Furthermore, according to the logic circuit design method of the present invention, flip-flop and latch circuits are deleted from the net list for a circuit to be designed, a basic logic circuit to be converted into a latch is extracted from the resultant net list, and a latch conversion circuit is added to the extracted basic logic circuit. As for the extracted basic logic circuit to be converted into a latch, a basic logic circuit positioned at a point in the circuit to be designed whereat the influence of clock skew is less adverse is selected. Accordingly, skew tolerance, which is indicative of the degree to which it is possible to nullify an adverse influence due to skew, can be maximized. Further, since a latch circuit is formed by providing the latch conversion circuit for the basic logic circuit positioned at the thus selected point, the through delay amount for the latch circuit can be minimized. Thus, for a circuit to be designed, the maximum skew tolerance and the minimum through delay amount can be achieved. Thus, a logic circuit operable at a high-speed can be achieved.

In addition, the single-bearing medium tangibly storing a program of machine-readable instructions for a logic circuit design according to the of the present invention, flip-flop and latch circuits are deleted from the net list for a circuit to be designed, a basic logic circuit to be converted into a latch is extracted from the resultant net list, and a latch conversion circuit is added to the extracted basic logic circuit. As for the extracted basic logic circuit to be converted into a latch, a basic logic circuit positioned at a point in the circuit to be designed whereat the influence of clock skew is less adverse is selected. Accordingly, skew tolerance, which is indicative of the degree to which it is possible to nullify an adverse influence due to skew, can be maximized. Further, since a latch circuit is formed by providing the latch conversion circuit for the basic logic circuit positioned at the thus selected point, the through delay amount for the latch circuit can be minimized. Thus, for a circuit to be designed, the maximum skew tolerance and the minimum through delay amount can be achieved.

BRIEF DESCRIPTION OF THE DRAWINGS

These and other exemplary features and advantages and further description of the present invention will be more apparent to those skilled in the art by reference to the description, taken in connection with the accompanying drawings, in which.

DETAILED DESCRIPTION OF THE PREFERRED EMBODIMENTS

First, the basic concept of the present invention will be described. According to a method for designing a logic circuit including a latch circuit of the present invention, in a first step, a circuit description (hereinafter referred to as a net list) which does not include circuits such as flip-flops and latch circuits is prepared. In a second step, by performing a delay examination process, a point (an optimal point) whereat the skew tolerance of the latch circuit is the maximum is extracted from the net list. In a third step, a latch conversion circuit is added to a basic logic circuit (hereinafter referred to as a logic gate) present at the point described above. As a result, the effects of maximization of the skew tolerance and of minimization of the through delay can be obtained.

Preferred embodiments of the present invention will now be described in detail with reference to the accompanying drawings. First, a logic circuit for an exemplary embodiment of the present invention will be described. The logic circuit comprises a latch circuit constituted of a latch conversion circuit according to this invention and a logic gate to which the latch conversion circuit is added.

Figure 1:
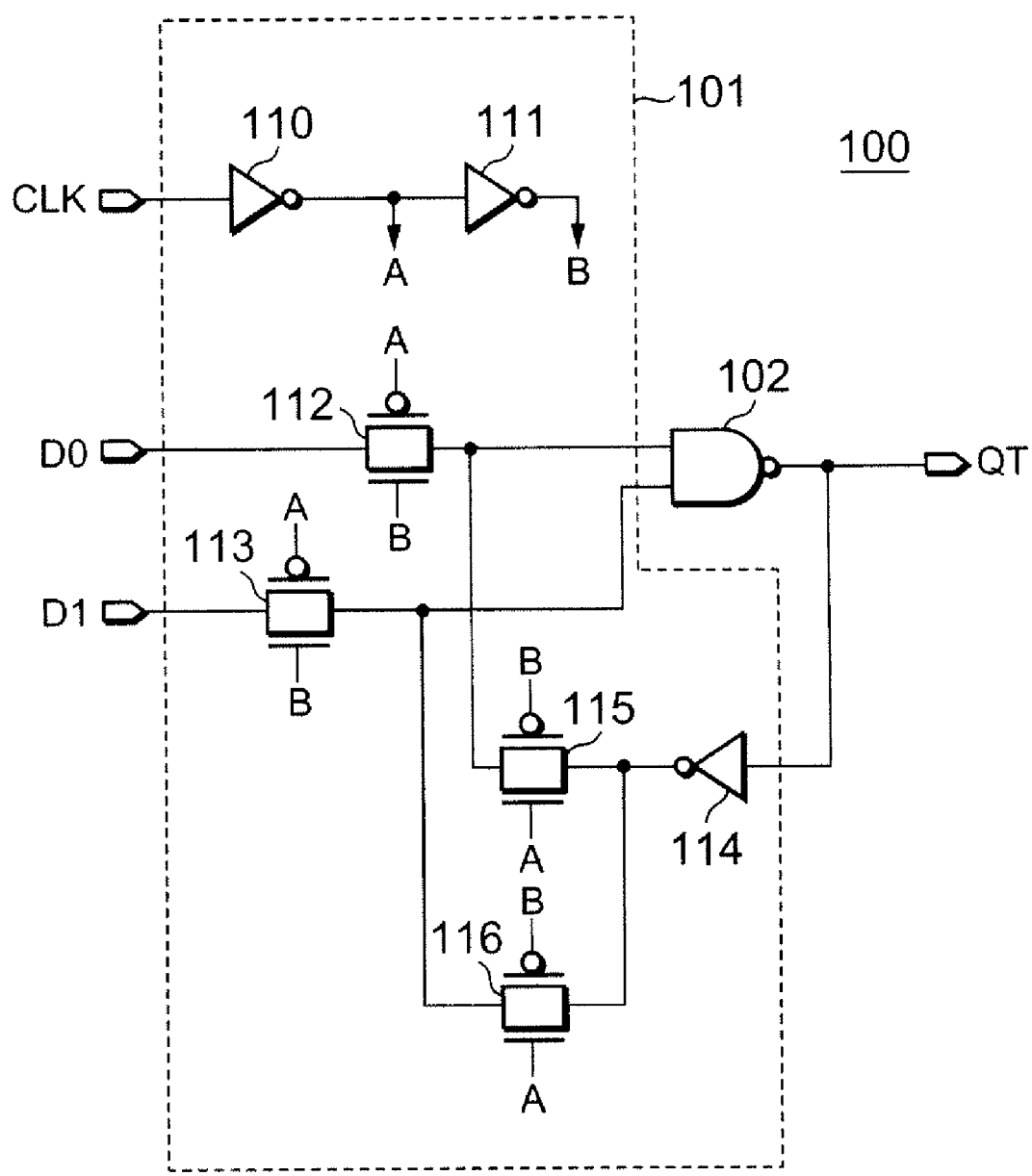
FIG. 1 is a circuit diagram showing a latch circuit according to an exemplary embodiment of the present invention, which is formed by adding a latch conversion circuit to a logic gate.

FIG. 1 is a circuit diagram showing the latch circuit of the embodiment of the present invention, which is formed by adding a latch conversion circuit to a logic gate. Referring to FIG. 1, shown is a latch circuit 100 which is constituted of a latch conversion circuit 101 and a NAND gate 102, which is an example of a logic gate to be converted into a latch.

The latch conversion circuit 101 includes: a clock inverter 110, for receiving a clock signal CLK and generating an inverted signal A of the clock signal CLK; a clock inverter 111, for generating a non-inverted signal B of the clock signal CLK; and first to fourth signal transmission means. In this embodiment, explanation will be given of the case where transmission gates are employed as the first to fourth signal transmission means. The latch conversion circuit 101 has a first transmission gate 112 as the first signal transmission means for selectively transmitting, in response to the clock signal CLK, a first input signal D0 to the first input terminal of the NAND gate 102. In the first transmission gate 112, an inverted signal A of the clock signal CLK is supplied to the gate of a P-channel transistor, and a non-inverted signal B of the clock signal CLK is supplied to the gate of an N-channel transistor.

The latch conversion circuit 101 has a second transmission gate 113 as the second signal transmission means for selectively transmitting, in response to the clock signal CLK, a second input signal D1 to the second input terminal of the NAND gate 102. In the second transmission gate 113, the inverted signal A of the clock signal CLK is supplied to the gate of a P-channel transistor, and the non-inverted signal B of the clock signal CLK is supplied to the gate of an N-channel transistor.

The latch conversion circuit 101 has a feedback inverter 114 which is inserted between the output terminal and the first input terminal of the NAND gate 102. The feedback inverter 114 receives the output by the NAND gate 102. The latch conversion circuit 101 has a third transmission gate 115 as the third signal transmission means for selectively transmitting, in response to the clock signal CLK, the output of the inverter 114 to the first input terminal. In the third transmission gate 115, the non-inverted signal B of the clock signal CLK is supplied to the gate of a P-channel transistor, and the inverted signal A of the clock signal CLK is supplied to the gate of an N-channel transistor.

The latch conversion circuit 101 has a fourth transmission gate 116 as the fourth signal transmission means for selectively transmitting, in response to the clock signal CLK, the output of the inverter 114 to the second input terminal. In the fourth transmission gate 116, the non-inverted signal B of the clock signal CLK is supplied to the gate of a P-channel transistor, and the inverted signal A of the clock signal CLK is supplied to the gate of an N-channel transistor.

An explanation will now be given of the operation of the latch circuit 100 formed by adding the latch conversion circuit 101 to the NAND gate 102. First, when the clock signal CLK is in the logic level High period, the transmission gates 112 and 113 are both rendered conductive by the output A of the clock inverter 110 and the output B of the clock inverter 111. During this period, both the transmission gates 115 and 116 are rendered non-conductive. When both the first input signal D0 and the second input signal D1 are High, the output QT of the NAND gate 102 becomes Low. And since both the transmission gates 115 and 116 are non-conductive, the output of the inverter 114 is not fed back to the input terminals of the NAND gate 102. During this period, the latch circuit 100 does not perform a latch operation and is in the through mode.

When the clock signal CLK is in the logic level Low period, both the transmission gates 112 and 113 are rendered non-conductive by the output A of the clock inverter 110 and the output B of the clock inverter 111. Meanwhile the transmission gates 115 and 116 are rendered conductive by the output A of the clock inverter 110 and the output B of the clock inverter 111.

Therefore, the output QT of the NAND gate 102 at level Low is inverted by the feedback inverter 114, and becomes logic level High. The output of the feedback inverter 114 at logic level High is fed back to the input terminals of the NAND gate 102 through the transmission gates 115 and 116.

Since the output QT of the NAND gate 102 is Low, the latch circuit 100 maintains this output state by employing the feedback process described above. When the first input signal D0 or the second input signal D1 is not at logic level High unlike the above case, the latch circuit 100 is in the hold mode wherein the output QT of the NAND gate 102 at logic level High is maintained. In this manner, the latch circuit 100 can perform a latch operation corresponding to the logic function of the logic gate. Thus, the latch circuit 100 can constitute a high-through latch circuit.

According to the above described logic circuit, a latch conversion circuit is prepared that is to be added to a basic logic circuit to obtain a latch circuit having an extremely small through delay amount. Therefore, by adding this latch conversion circuit to a basic logic circuit located at a point which is obtained as a latch circuit position described later to construct the latch circuit, a latch circuit can be obtained that, to the extent possible, is not affected either by skew or by jitter.

Figure 3:
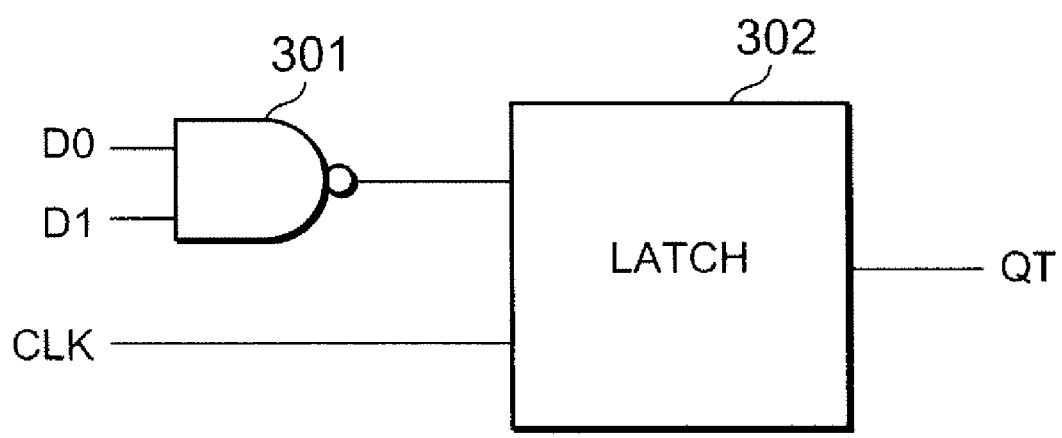
FIG. 3 is a configuration diagram showing an example wherein a conventional technique is employed to form a circuit of the embodiment.

As is shown in FIG. 3, a conventional pipeline is constituted by employing, as basic units, a logic circuit 301, and a latch circuit 302 by which, in accordance with a clock signal CLK, the output of the logic circuit 301 is set to a hold mode or a through mode. The latch circuit 302, in the hold mode, latches input data and output the data, while in the through mode, does not latch input data and output the data as it is. For this pipeline, since the latch circuit 301 and the latch circuit 302 are connected in series, the circuit delay amount for such a pipeline is equal in size to the sum of the delay amounts of the logic circuit 301 and of the latch circuit 302 in the through mode. That is, the circuit delay amount is the sum of the two delay amounts, and the delay is large.

On the other hand, according to the latch circuit 100 of the embodiment of the present invention shown in FIG. 1, the latching of the output of the logic gate is implemented by the latch conversion circuit 101 which converts the logic gate into a latch. Thus, the circuit delay amount of the latch circuit 100 in the through mode equals the sum of the delay amount for the NAND gate 102 and the delay amount for the latch conversion circuit 101.

The delay in the latch conversion circuit 101, however, is caused by the first transmission gate 112, which is in the conductive state and which transmits the first input signal D0 to the first input terminal of the NAND gate 102, and the second transmission gate 113, which is also in the conductive state and which transmits the second input signal D1 to the second input terminal of the NAND gate 102. The latch conversion circuit 101 acts as a slight increaser of a load-carrying capacitance for the input/output of the NAND gate 102. Therefore, according to the latch circuit in the embodiment of the present invention shown in FIG. 1, achieved is the delay amount which is considerably smaller than the delay amount of the conventional pipeline shown in FIG. 3.

Figure 2:
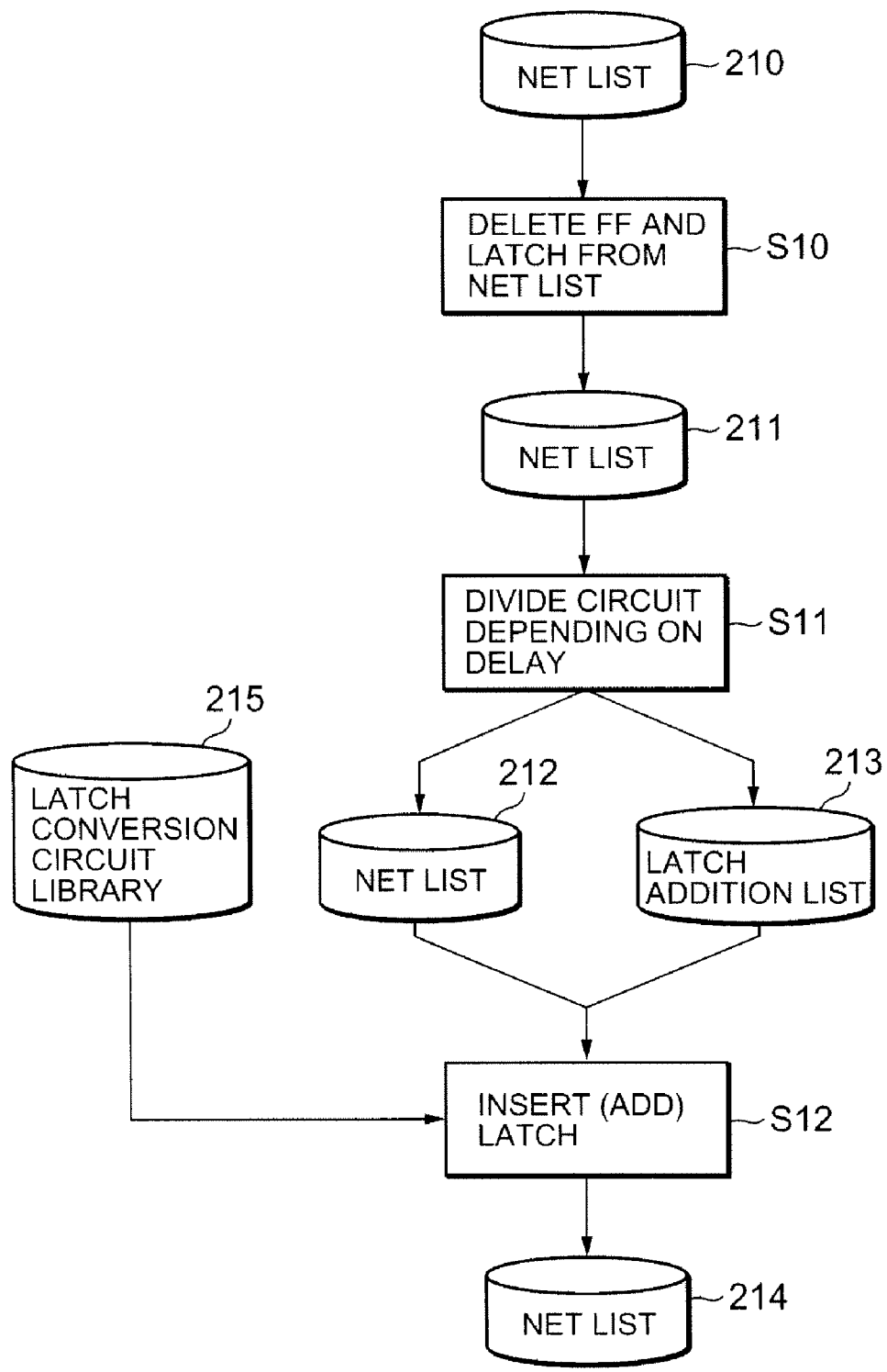
FIG. 2 is a flowchart for explaining a logic circuit design method of the present invention.

Next, an exemplary logic circuit design method according to the embodiment of the present invention will be described with reference to the drawings. Referring to FIG. 2, in the logic circuit design method of the present invention, two sets of input data are prepared in advance, one set being a net list 210, and the other set being a latch conversion circuit library 215 corresponding to various types of logic gates.

In step S10, which is a step of deleting flip-flop and latch circuits from a net list for a circuit to be designed, flip-flop and latch circuits for a sequential circuit are deleted from the net list 210. When negative logic values are outputted by the deleted flip-flop and latch circuits, an inverter is inserted for each place. When positive logic values are outputted by the deleted flip-flop and latch circuits, a net list 211 is outputted without any further process being performed.

Then, in step S11, which is a step of dividing a circuit depending on the delay, the net list 211 is searched, and a logic gate to which a latch conversion circuit is to be added is extracted. Based on the results of the extraction, a net list 212, related to the extracted logic gate, and a latch addition list 213, for the logic gate to which a latch conversion circuit is added, are output. In such step S1, which is a step of dividing a circuit depending on the delay, a delay examination process is performed to find a logic gate located at the optimal delay position whereat a latch conversion circuit should be added, when detecting a logic gate to which a latch conversion circuit is to be added. The net list 212 and the net list 211 are identical.

Finally, in step S12, which is a step of adding a latch circuit, an appropriate latch conversion circuit for the logic gate included in the net list 212 is added, in accordance with the latch addition list 213, for the logic gate to which a latch conversion circuit should be added, and while referring to the latch conversion circuit library 215. Thereafter, a net list 214 in which the addition of a latch conversion circuit has been performed is output. As a result, the logic circuit design is completed.

Figure 4:
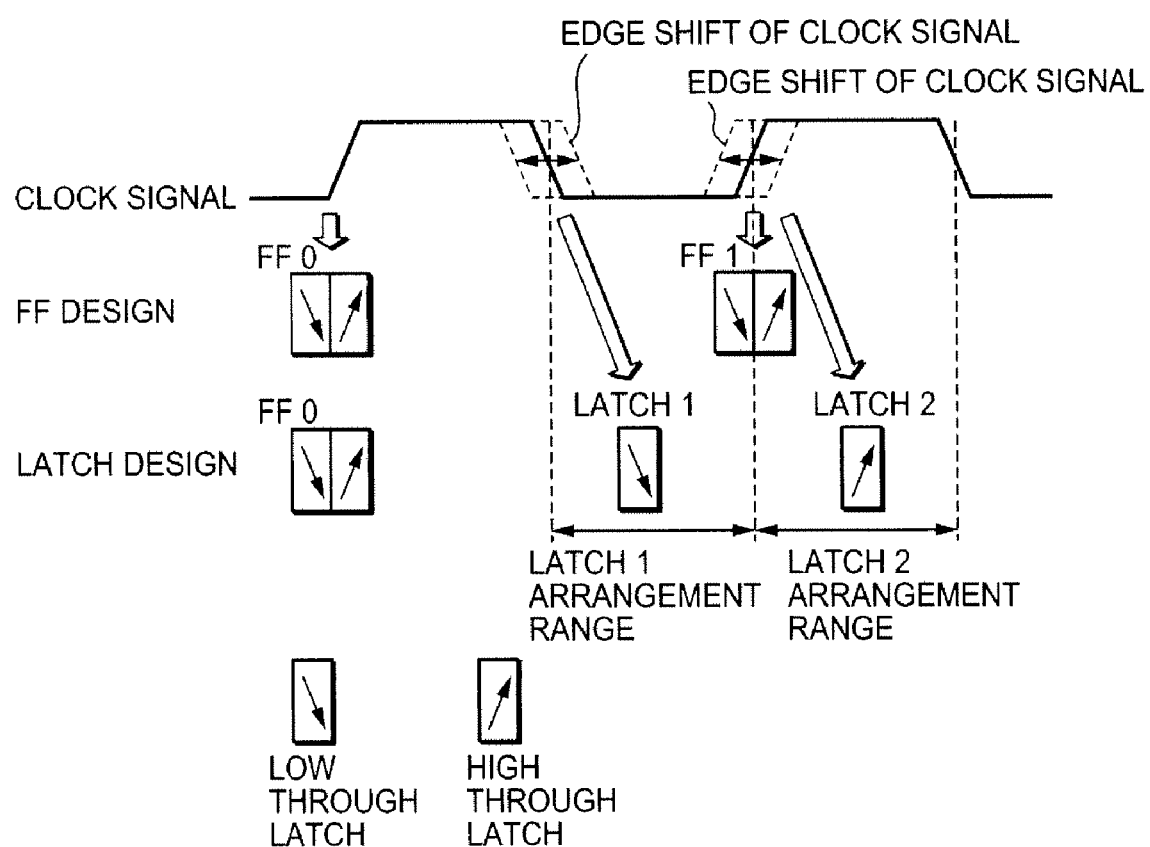
FIG. 4 is a timing chart for explaining a comparison between a design employing a flip-flop and a design employing a latch circuit.

An explanation will now be given of the above described optimal point whereat a logic gate to be converted into a latch should be arranged. First, an explanation will be given of the comparison between a circuit design employing a flip-flop and a circuit design employing a latch circuit. Referring to FIG. 4, generally, skew or jitter, which is a shifting of the edge due to the distribution of signals, is present in a clock signal. Since a flip-flop performs an edge triggered operation, a delay design for a circuit which takes into account the shifting of the edge of a clock signal is required. Especially when the design of a high-speed LSI is performed, the edge shifting, such as skew or jitter, has a large influence, and is a factor in the deterioration of the LSI performance.

For a circuit design which employs a flip-flop, a signal outputted by a flip-flop FF0 must be transmitted to the next flip-flop FF1 within one cycle period. However, in actuality, a signal outputted by the flip-flop FF0 must reach the flip-flop FF1 within a period which is shorter than one cycle period. That is, there is a constraint that the signal must be transmitted to the flip-flop FF1 within a delay time obtained by subtracting the shifting of the edge of a clock signal, i.e., the skew or the jitter amount.

On the other hand, for a circuit design which employs a latch circuit, a latch circuit 1, which is a low through latch, can be arranged in a period when the logic level of a clock signal is Low, and a latch circuit 2, which is a high through latch, can be arranged in a period when the logic level of a clock signal is High.

Furthermore, the pair of latch circuits 1 and 2 functions as a flip-flop, and when one of the latch circuit 1 and the latch circuit 2 is in the through mode, the other is in a hold mode. Therefore, the probability that a so-called punch-through of a signal will occur is about the same as that for a circuit design which uses a flip-flop.

Figure 5:
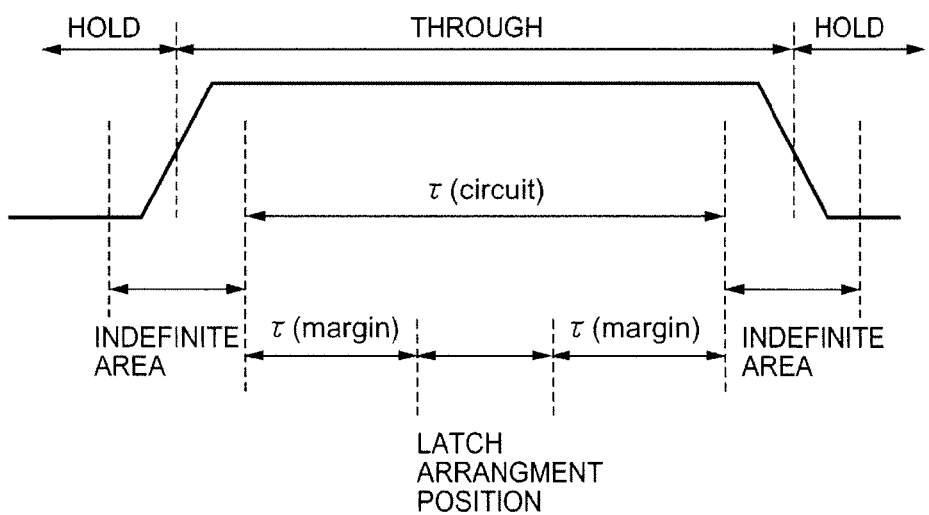
FIG. 5 is a timing chart for explaining an example for obtaining an optimal position for a latch circuit within a 0.5 cycle.

With reference to FIG. 5, an explanation will be given of an example wherein the optimal position for arranging a latch circuit within a 0.5 cycle is obtained. Here, a position to which a latch circuit is to be added will be explained in the case of a high through latch circuit by way of example. The high through latch can be arranged wherever within the High period for a clock signal. However, when the high through latch is arranged near the clock edge, the clock signal and the input data signal may be shifted at the same time, and a delay fluctuation due to this would occur. Therefore, a specific margin is usually provided with respect to the clock edge, and a latch circuit and a flip-flop are not arranged in that area. This margin value is generally called a setup time. However, in order to provide what is generally implied for this margin, an area wherein the data signal and the clock signal of the latch circuit interfere with each other is defined as an indefinite area. The area wherein the latch circuit can be arranged is the area obtained by excluding the indefinite area from the period during which the clock signal is High. The skew and jitter described above affect both the leading edge and the trailing edge of the clock signal.

Therefore, the optimal point for the latch circuit is a position distant from both edges as much as possible, i.e., just the middle point of an area obtained by excluding the indefinite areas from the High period. The area denoted by $\tau$ (margin) in FIG. 5 is an area which has a function of absorbing the shifting of the clock edge, i.e., the skew or the jitter. When the shifting is equal to or smaller than $\tau$ (margin), it does not adversely affect the circuit delay.

In step S11 in FIG. 2, the delay examination process is performed, a point whereat the margin $\tau$ is the maximum is searched for on the basis of the examination result, and a logic gate present at that point is reported. In this process, as is seen from FIG. 5, while a through delay amount Tpd after a latch conversion circuit has been added is required, this can be dealt with by describing the longest delay amount in the latch conversion circuit library 215 in advance. Further, when the configuration for the latch circuit in the embodiment of the present invention is employed, a through delay amount can be considerably smaller than that of the conventional one.

As is described above, according to the logic circuit design method of this embodiment, a latch conversion circuit is prepared in advance that is to be added to a basic logic circuit to obtain a latch circuit having an extremely small through delay amount. Then, a latch circuit position whereat the shifting of the clock edge, such as skew or jitter, has the least influence is obtained. If the latch conversion circuit is added to the basic logic circuit located at the thus obtained point to form a latch circuit, it becomes possible to design a latch circuit which is not, to the extent possible, affected by skew or jitter.

Figure 6:
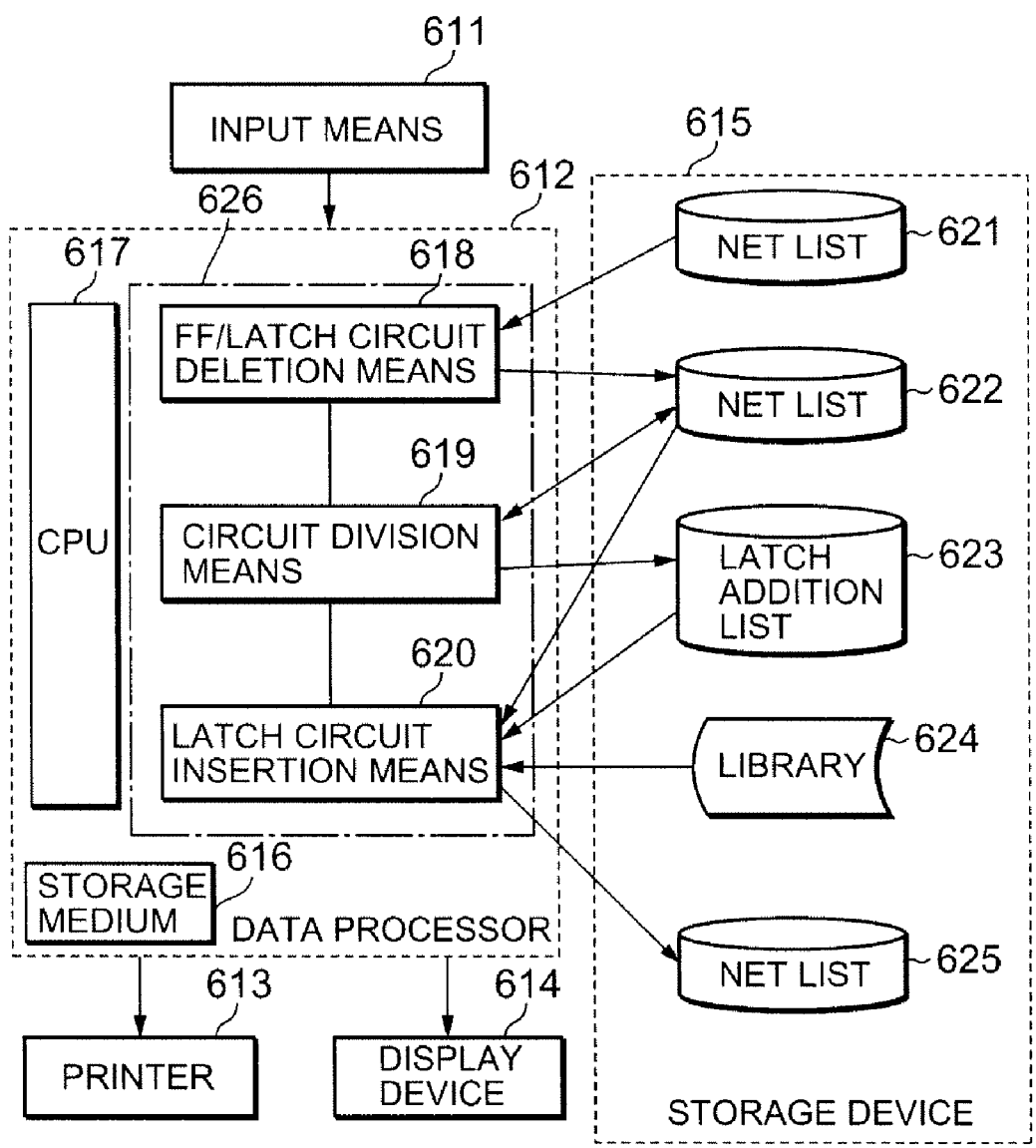
FIG. 6 is a diagram showing the configuration of a logic circuit design system employing a latch conversion circuit addition method.

An explanation will now be given of an exemplary logic circuit design system according to the embodiment of the present invention for which the latch conversion circuit addition method of the present invention is applied. Referring to FIG. 6, the logic circuit design system of the present invention comprises: a data processor 612; data input means 611 such as a keyboard or a mouse, which is used to input data for the data processor 612; a storage device 615 in which process data and process results data are stored in accordance with an instruction from the data processor 612; a printer 613 for printing process data and process results data in accordance with an instruction from the data processor 612; and a display apparatus 614 for displaying process data and process results data in accordance with an instruction from the data processor 612. A first net list 621, a second net list 622, a latch addition list 623, a library 624 and a third net list 625 are stored in the storage device 615.

In the logic circuit design system, the data processor 612 operates under the control of a central processing unit (CPU) 617 on the basis of a program stored on a storage medium 616. The data processor 612 includes latch conversion circuit addition means 626. The latch conversion circuit addition means 626 has FF/latch circuit deleting means 618 which deletes, from the first net list 621 describing connection information for a circuit to be designed, flip-flop and latch circuits for a sequential circuit, and which outputs the results as the second net list 622. When the outputs of the deleted flip-flop and latch circuits are negative logic values, the flip-flop/latch circuit deleting means 618 inserts an inverter for each place to invert the output value at the front stage. When the outputs are positive logic values, the flip-flop/latch circuit deleting means 618 maintains the output value at the front stage, unchanged. The connection information concerning the results of the replacement is outputted as the second net list 622.

The latch conversion circuit addition means 626 includes circuit dividing means 619, which searches the second net list 622 from which the flip-flop and latch circuits have been deleted, extracts a logic gate to which a latch conversion circuit should be added, and outputs the extracted logic gate to be converted into a latch to the latch addition list 623. In the process for detecting the logic gate to which a latch conversion circuit should be added, the delay examination process is performed to find a logic gate located at the optimal delay position to which a latch conversion circuit should be added.

The latch conversion circuit addition means 626 also includes latch circuit insertion means 620, which adds a latch conversion circuit to the extracted logic gate included in the latch addition list 623 and outputs the third net list 625. In accordance with the latch circuit addition list 623, and with reference to the latch conversion circuit library 624 of the latch conversion circuits corresponding to various types of logic gates, the latch circuit insertion means 620 adds a corresponding latch conversion circuit to the logic gate to be converted into a latch. Then, the latch circuit insertion means 620 outputs the obtained results as the third net list 625.

The above latch conversion circuit addition means 626 includes, as externally input data for a latch conversion circuit addition process, at least the net list 621 for a circuit network to be designed and the latch conversion circuit library 624. The net list 621 in this embodiment is connection information for a circuit network to be designed. The library 624 in this embodiment describes latch conversion circuits corresponding to various types of logic gates used in the circuit network to be designed. Moreover, in this library 624, the maximum through delay amount according to the delay characteristic obtained after the latch conversion circuit has been added is described also. The maximum through delay amount is the maximum value of the delay amounts according to the characteristic of a logic gate to which a latch conversion circuit is to be added, and is externally entered, in advance, to the library 624. In this embodiment, this maximum value is employed as the maximum through delay amount.

According to the above described logic circuit design system, a latch conversion circuit is prepared that is to be added to a basic logic circuit to obtain a latch circuit having an extremely small through delay amount, and a latch circuit position is obtained whereat the shifting of the clock edge, such as skew or jitter, can be absorbed to the maximum extent possible. By providing means for forming a latch circuit by adding the latch conversion circuit to the basic logic circuit located at the obtained point, a latch circuit can be designed that is not, to the extent possible, affected by skew or jitter and that has a small through delay amount. Accordingly, it is possible to realize a logic circuit in a pipeline structure which is little affected by skew and jitter and which has a small overall through delay amount. The present invention is suitable for an LSI which operates a logic circuit in a pipeline structure at a high speed.

Figure 7:
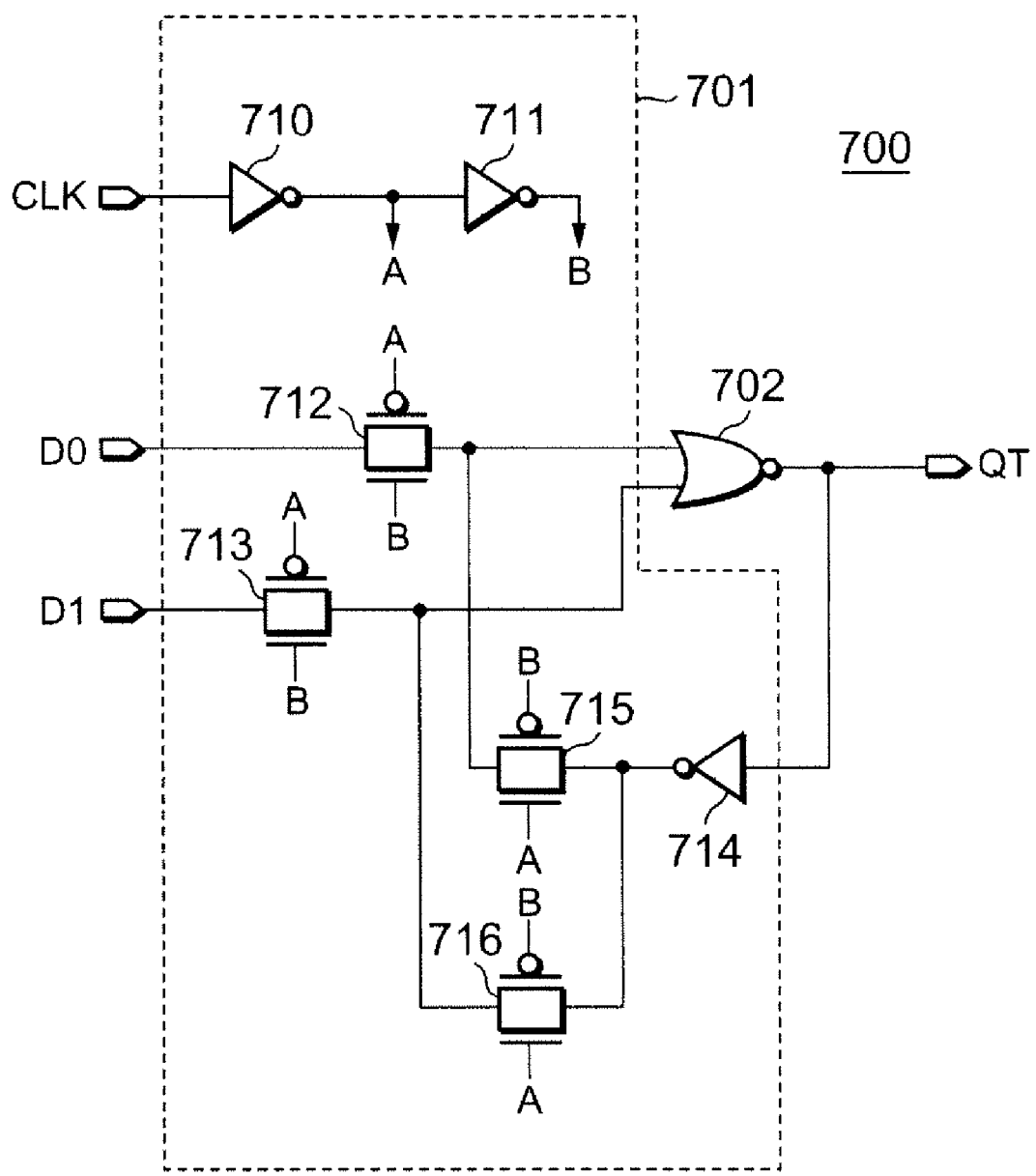
FIG. 7 is a circuit diagram showing a latch circuit, according to another exemplary embodiment of the present invention, which is formed by adding a latch conversion circuit to a logic gate.

The preferred embodiment has been explained; however, the present invention is not limited to this embodiment. For example, while the explanation has been given of the latch circuit formed by adding the latch conversion circuit to the NAND gate, a latch circuit can be formed by adding a latch conversion circuit to another logic gate, such as a NOR gate. Since the configuration and operation of the latch conversion circuit are similar to those of the latch conversion circuit 101 shown in FIG. 1, detailed description will be omitted. Referring to FIG. 7, shown is a latch circuit 700 which is constituted of a latch conversion circuit 701 and a NOR gate 702, which is a logic gate to be converted into a latch. The latch conversion circuit 701 has a clock inverter 710, for receiving a clock signal CLK and generating an inverted signal A of the clock signal CLK. The latch conversion circuit 701 also has a clock inverter 711, for generating a non-inverted signal B of the clock signal CLK. Moreover, the latch conversion circuit 701 has first to fourth signal transmission means. Here, an explanation will be given of the case where transmission gates are used as the first to fourth signal transmission means. The latch conversion circuit 701 has a transmission gate 712 as the first signal transmission means which, in response to the clock signal CLK, selectively transmits a first input signal D0 to the first input terminal of the NOR gate 702. The latch conversion circuit 701 has a second transmission gate 713 as the second signal transmission means which, in response to the clock signal CLK, selectively transmits a second input signal D1 to the second input terminal of the NOR gate 702. The latch conversion circuit 701 also has a feedback inverter 714 which is inserted between the output terminal and the first input terminal of the NOR gate 702. The feedback inverter 714 receives the output from the NOR gate 702. The latch conversion circuit 701 has a third transmission gate 715 as the third signal transmission means which, in response to the clock signal CLK, selectively transmits the output of the feedback inverter 714 to the first input terminal. The latch conversion circuit 701 has a fourth transmission gate 716 as the fourth signal transmission means which, in response to the clock signal CLK, selectively transmits the output of the feedback inverter 714 to the second input terminal. The inverted signal A and the non-inverted signal B of the clock signal CLK are supplied to the first to the fourth transmission gates 712, 713, 715 and 716.

The operation of such a latch circuit 700 will now be described. First, during a period during which the logic level of the clock signal CLK is High, the transmission gates 712 and 713 are both rendered conductive by the output A of the clock inverter 710 and the output B of the clock inverter 711. During this period, both the transmission gates 715 and 716 are non-conductive. When both the first input signal D0 and the second input signal D1 are Low, an output QT of the NOR gate 702 becomes High. Since the transmission gates 715 and 716 are non-conductive, the output of the feedback inverter 714 is not fed back to the input terminals of the NOR gate 702. During this period, the latch circuit 700 does not perform a latch operation.

During a period during which the logic level of the clock signal CLK is Low, the transmission gates 712 and 713 are rendered non-conductive by the output A of the clock inverter 710 and the output B of the clock inverter 711. During this period, the transmission gates 715 and 716 are rendered conductive. Therefore, the output QT of the NOR gate 702 at level High is inverted by the feedback inverter 714, and becomes level Low. The output of the feedback inverter 714 at level Low is fed back through the transmission gates 715 and 716 to the input terminals of the NOR gate 702. The output QT of the NOR gate 702 is at level High, and by using such a feedback, the latch circuit 700 maintains its output state. When the logic level of the first input signal D0 or the second input signal D1 is not level Low unlike the above case, the output QT of the NOR gate 702 is maintained at level Low. In this manner, the latch circuit 700 can perform a latch operation corresponding to the logic function of the logic gate. The latch circuit 700 can constitute a high-through latch circuit. As is described above, the latch conversion circuit described above can also be applied when the NOR gate is employed as a logic circuit.

Although the latch circuit 100 shown in FIG. 1 and the latch circuit 700 shown in FIG. 7 are high through latch circuits, in order to implement a low through latch circuit, during the period which the logic level of the clock signal CLK is Low, the inverted signal A and the non-inverted signal B of the clock signal CLK are supplied to the first to fourth signal transmission means so that the first and second signal transmission means are rendered conductive and the third and fourth signal transmission means are rendered non-conductive. Further, during the period which the logic level of the clock signal CLK is High, the inverted signal A and the non-inverted signal B of the clock signal CLK are supplied to the first to fourth signal transmission means so that the first and second signal transmission means are rendered non-conductive and the third and fourth signal transmission means are rendered conductive. Specifically, the non-inverted signal B of the clock signal CLK is supplied to the gates of the P-channel transistors of the first and second transmission gates, and the inverted signal A of the clock signal CLK is supplied to the gates of the N-channel transistors of the first and second transmission gates. Furthermore, the inverted signal A of the clock signal CLK is supplied to the gates of the P-channel transistors of the third and fourth transmission gates, and the non-inverted signal B of the clock signal CLK is supplied to the gates of the N-channel transistors of the third and fourth transmission gates. That is, the low through latch circuit can be obtained by the simple alteration of the latch circuit 100 shown in FIG. 1 or the latch circuit 700 shown in FIG. 7.

For the above described logic circuit design method, an explanation has been given of the case of the high through latch circuit with reference to FIG. 5. For a low through latch circuit, an example process for obtaining the optimal position for arranging the latch circuit within the 0.5 cycle is performed in the following manner. A low through latch can be arranged wherever within a period during which the clock signal is Low. However, when the low through latch is arranged too near the clock edge, the clock signal and the input data signal may be shifted at the same time, and this shift would cause a delay fluctuation. Assuming that the area wherein the data signal and the clock signal of the latch circuit interfere with each other is defined as an indefinite area. The area wherein the latch circuit can be arranged is the area obtained by excluding the indefinite area from the period during which the clock signal is Low. The skew and jitter described above affect both the leading edge and the trailing edge of the clock signal. Therefore the optimal point for the latch circuit is a position distant from both edges as much as possible, i.e., just the middle point of the area obtained by excluding the indefinite areas from the Low period. In this manner, also in the case of the low through circuit, the optimal position for arranging the latch circuit within the 0.5 cycle can be obtained. Then, the latch circuit is formed by adding a latch conversion circuit to the logic circuit present at this position.

Although the preferred embodiments of the present invention have been described with reference to the drawings, it will be obvious to those skilled in the art that various changes or modifications may be made without departing from the true scope of the present invention.

What is claimed is:

1. A computer implemented sequential logic circuit design method comprising:
   using a plurality of basic logic circuits to form a pipeline in which flip-flops and latches are inserted between basic logic circuits on the basis of a target cycle time;
   preparing a circuit description as a net list of the sequential circuit including the flip-flops and latches;
   inputting the prepared net list;
   deleting by the computer flip-flop and latch circuits from the prepared net list and inserting for deletions either a signal inversion means for negative logic or a non-inverting logic for positive logic for the sequential logic circuit to be designed to generate a resultant net list;
   extracting by the computer, from said resultant net list, an optimal point or points whereat skew tolerance of one or more basic logic gates is a maximum;
   adding by the computer a latch conversion circuit to the one or more basic logic gates for which skew tolerance is determined to be a maximum, the adding step converting a basic logic circuit to a latch conversion circuit; and
   generating a new net list of the sequential circuit including added latch conversion circuit or circuits to produce a sequential circuit which maximizes skew tolerance and minimizes through delay.

2. A computer implemented sequential logic circuit design method according to claim 1,
   wherein said extracting of said basic logic circuit is carried out by performing a delay examination process for said resultant net list for a circuit to be designed from which said flip-flop and latch circuits have been deleted, and by searching for one or more basic logic circuits at delay positions whereat a latch conversion circuit is to be added.

3. A computer implemented sequential logic circuit design method according to claim 2,
   wherein, when said basic logic circuit at said delay position to which said latch conversion circuit is to be added is searched for, indefinite areas where, at a leading edge of a clock signal at which said latch circuit becomes in a through state and at a trailing edge of said clock signal, a clock signal and a data signal interfere with each other are obtained, respectively; and
   wherein a region between said obtained indefinite areas is regarded as a range for the arrangement of a latch circuit, and a midpoint of said region is extracted as an optimal point for said latch circuit arrangement.

4. A computer implemented sequential logic circuit design method according to claim 3,
   wherein, when said basic logic circuit at said delay position to which said latch conversion circuit is to be added is searched for, an externally predesignated range is excluded as a through delay area obtained after said addition of said latch conversion circuit from said range for arrangement of a latch circuit, and remaining areas are obtained as delay margins on said leading edge side and on said trailing edge side.

5. A computer implemented sequential logic circuit design method according to claim 4,
   wherein, when said basic logic circuit at said delay position to which said latch conversion circuit is to be added is searched for, a point whereat said remaining areas, which are said delay margins at said leading edge and at said trailing edge, reach their maximum size is searched for, and a basic logic circuit present at that point is extracted.

6. A computer implemented sequential logic circuit design method according to claim 4,
   wherein, as a value for an externally predesignated range, a maximum through delay amount according to a delay characteristic obtained after said addition of said latch conversion circuit is described in advance in said latch conversion circuit library.

7. A computer implemented sequential logic circuit design method according to claim 1,
wherein, as externally input data used in the step of adding said latch conversion circuit, at least said net list for said circuit to be designed and a library of latch conversion circuits corresponding to various types of basic logic circuits are employed.

8. A computer implemented sequential logic circuit design method according to claim 1, further comprising:
employing, as input data, said prepared net list and a library of latch conversion circuits corresponding to various types of basic logic circuits;
outputting a second net list as said resultant net list;
searching said second net list to find one or more basic logic circuits to which a latch conversion circuit is to be added, and outputting said one or more basic logic circuits to be converted into a latch or latches as a latch addition list;
referring to said library of latch conversion in accordance with said latch addition list; and
outputting a third net list in which, to said one or more basic logic circuits in said second net list, a corresponding latch conversion circuit is added.

9. A sequential logic circuit design system comprising:
a data processor;
a storage device for storing a first net list of a plurality of basic logic circuits to form a pipeline in which flip-flops and latches are inserted between basic logic circuits on the basis of a target cycle time, a second net list, a latch addition list, a library of latch conversion circuit corresponding to various types of logic gates used in the sequential logic circuit design, and a third net list;
said data processor having latch conversion circuit addition means for deleting flip-flop and latch circuits from a net list stored as the first net list for a circuit to be designed and storing a resultant net list as the second net list, extracting, from said resultant net list, one or more logic circuits to be converted into a latch circuit by performing a delay examination process to determine a point or points whereat the skew tolerance of the latch circuit is a maximum and storing the result in said latch addition list, and then accessing said library and adding a latch conversion circuit to said logic circuit presented at the point to generate a final net list, and storing the final net list in said third net list.

10. A sequential logic circuit design system according to claim 9,
wherein said latch conversion circuit library includes a maximum through delay amount according to a delay characteristic obtained after said addition of said latch conversion circuit.

11. A sequential logic circuit design system according to claim 9,
wherein said latch conversion circuit addition means includes:
flip-flop/latch circuit deletion means for deleting flip-flop and latch circuits in a circuit to be designed from a first net list, replacing, with predetermined logic values, outputs corresponding to said thus deleted circuits, and outputting said results as a second net list;
circuit division means for searching said second net list to find one or more basic logic circuits to be converted into a latch, and outputting said one or more basic logic circuits to be converted into a latch or latches as a latch circuit addition list; and
latch circuit insertion means for referring to said latch conversion circuit library in accordance with said latch circuit addition list, adding a corresponding latch conversion circuit to said one or more basic logic circuits which are to be converted into a latch, and outputting said obtained results as a third net list.

12. A computer readable storage device storing a program when executed by a computer process, the program comprising:
employing, as input data, a first net list and a library of latch conversion circuits corresponding to various types of basic logic circuits, deleting flip-flop and latch circuits of a sequential circuit from said inputted first net list, inserting, into said first net list, either a signal inversion means, when said deleted sequential circuit is for negative logic, or a non-inverting logic, when said deleted sequential circuit is for positive logic, and newly outputting a second net list;
searching said second net list to find a basic logic circuit to which a latch conversion circuit is to be added, and outputting said one or more basic logic circuits to be converted into a latch or latches as a latch addition list; and
referring to a latch conversion circuit library in accordance with said latch addition list, and outputting a third net list in which, to said basic logic circuit in said second net list, a corresponding latch conversion circuit is added at a point whereat a skew tolerance is a maximum.

\* \* \* \* \*